United States Patent [19]

Gatti

[11] 4,312,420

[45] Jan. 26, 1982

[54] SOUND DIFFUSION PLANT WITH VERY LOW DIRECTIVITY

[75] Inventor: Luigi Gatti, Bologna, Italy

[73] Assignee: Harp S.a.S. di Luigi Gatti & C., Modena, Italy

[21] Appl. No.: 121,301

[22] Filed: Feb. 13, 1980

[30] Foreign Application Priority Data

Feb. 16, 1979 [IT] Italy .............................. 40023 A/79

[51] Int. Cl.[3] .............................................. H05K 5/00

[52] U.S. Cl. ..................................... 181/146; 181/199

[58] Field of Search ................................ 181/145-147, 181/151, 153, 155, 163, 196, 199; 179/1 E, 115.5 R, 115.5 PS

[56] References Cited

U.S. PATENT DOCUMENTS 2,969,848 1/1961 Farwell .............................. 181/145

3,145,265 8/1964 Tamura et al. ................. 181/146 X 3,909,531 9/1975 Plummer ......................... 181/145 X

*Primary Examiner*—Lawrence R. Franklin

*Assistant Examiner*—Benjamin R. Fuller

*Attorney, Agent, or Firm*—Mason, Fenwick & Lawrence

[57] ABSTRACT

Disclosed herein is a sound diffusion plant with very low directivity. The plant, normally of the multiway type, is essentially characterized by the fact that each way comprises a pair of loudspeakers arranged one opposite the other, the diaphragms of which are enclosed in a space delimitated by screening elements made of high acoustic absorption material.

The said plant enables the sound diffusion to be uniform in the surrounding space and makes it possible to limit greatly undesired effects, such as for example, sound "haloes" and identical sounds reproduced by different ways being out of phase.

5 Claims, 2 Drawing Figures

SOUND DIFFUSION PLANT WITH VERY LOW DIRECTIVITY

BACKGROUND OF THE INVENTION

The invention relates to a sound diffusion plant with very low directivity.

DESCRIPTION OF THE PRIOR ART

Sound diffusion plants (commonly known as boxes or diffusers) of any good standard utilize a number of loudspeakers, or electro-acoustic transducers provided with vibrating diaphragms, in order to transmit sounds at the various frequencies that fall within the audible range. This is due to the fact that, as is known, loudspeakers that transmit, with good fidelity, sounds at low frequencies are not suitable to transmit properly sounds at high frequencies and vice versa. Such plants are commonly known to have "a number of ways".

Each way prevalently diffuses one predetermined frequency band.

In the reproduction of sound, there are various factors that contribute towards creating unfaithful reproduction, certain of these being attributable to the diffusion plants.

The sound produced by musical instruments is, for example, diffused in the surrounding space by means of spherical waves. The sound of the said instrument reproduced by the vibrating diaphragm of a loudspeaker is diffused, in part, by spherical waves and, in part, by directional waves.

The sounds that have the major frequencies of the band reproduced by the loudspeaker create, in fact, a different acoustic pressure at points equidistant from the said loudspeaker, that is to say, they are irradiated principally in one precise direction. This phenomenon is picked up perfectly by the human ear which, in fact, is aware of sound sensations that differ according to the position at which it is located with respect to the diffusion plant.

Another fault experienced with known diffusion plants is due to inertia on the part of the vibrating diaphragms of the loudspeakers which causes them to continue to vibrate even once the electric signal that excites them is cancelled. This creates an unnatural "halo" around the reproduced sound which is audible to the human ear.

SUMMARY OF THE INVENTION

One object of the invention is to overcome the aforementioned difficulties by making available a sound diffusion plant that diffuses the sounds, in a uniform fashion, over the full surrounding space, and that does not create annoying "sound haloes" resulting from the inertia of the vibrating diaphragms.

Another object of the invention is to make available a sound diffusion plant that does not send to a listener, positioned at any point in the surrounding area of the plant, a sound, reproduced by one way of the plant, that is out of phase with respect to the same sound reproduced by another of the ways of the said plant.

A further object of the invention is to make available a sound diffusion plant of high fidelity and great reliability.

These and other objects too have all been attained with the multiway type plant forming the subject of the invention, essential features of which are that each way comprises: a pair of vibrating diaphragms, placed coaxially one opposite the other and suitably interspaced, each of the said diaphragms being placed under vibration, by a corresponding electromagnetic circuit, the said electromagnetic circuits being energized by the same electric signal; and a plurality of screening elements made of high acoustic absorption material, shaped and arranged in such a way as to delimitate, with the said diaphragms, an internal space that communicates with the outside space and contains the said diaphragms, the contour area of which intercepts all the directions that issue radially from the said diaphragms.

BRIEF DESCRIPTION OF THE DRAWINGS

Further characteristics and advantages of the invention will emerge from the detailed description that follows of one preferred but not sole form of embodiment for the sound diffusion plant in question, illustrated purely as an unlimited example on the accompanying drawings, in which.

DESCRIPTION OF THE PREFERRED EMBODIMENT

Figure 2:
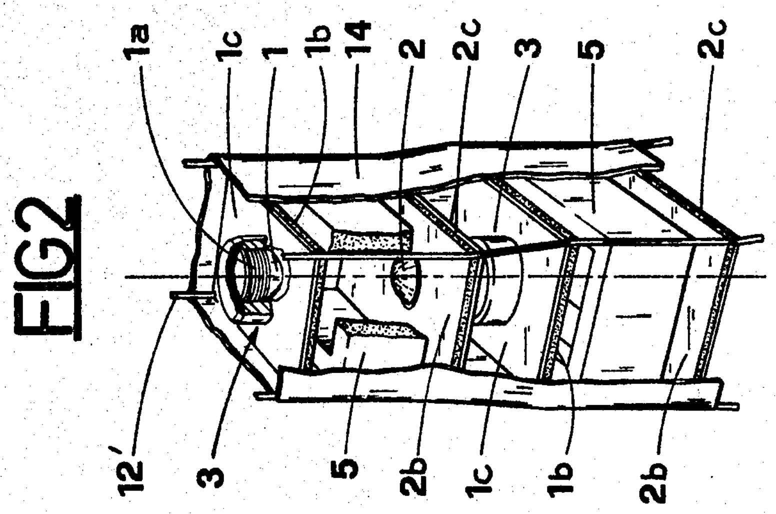
FIG. 2 shows, in a reduced scale, a diagrammatic perspective view, with certain parts removed in order that others may become more apparent, of part of the sound diffusion plant in question, in which two ways of the said plant can be seen.

The plant in question is, as stated previously, of the multiway type.

Each way comprises a pair of vibrating diaphragms (1) and (2), each energized by a corresponding electromagnetic circuit, (1*a*) and (2*a*), respectively. The shape and the area of the said vibrating diaphragms are the same, and they are placed coaxially one opposite the other, suitably interspaced. In the example depicted in the figures the two diaphragms are of spherical cap shape and belong to dome type loudspeakers of a known type, numbered (3) and (4), respectively.

For reasons that are clarified in the ensuring description, the said diaphragms (1) and (2) differ in gage.

A plurality of screening elements made of high acoustic absorption material are provided. The said elements comprise a pair of flat elements (1*b*) and (2*b*), each fixedly connected to a flat supporting surface, (1*c*) and (2*c*), respectively. The said flat elements (1*b*) and (2*b*) cover that part of the supporting surfaces (1*c*) and (2*c*),. respectively, not occupied by the diaphragm.

Furthermore, the said screening elements comprise a box shaped member (5), the bottom part (6) and (7) of which is open. The said box shaped member (5) is positioned in between the diaphragms (1) and (2), with the said bottom part turned towards the aforementioned diaphragms, and it is placed a distance away from each diaphragm that is lesser than the diameter of the said diaphragm.

The flat elements (1*b*) and (2*b*), the box shaped member (5) and the diaphragms (1) and (2) delimitate an internal space that contains the diaphragms (1) and (2) and communicates with the outside via the apertures (8) and (9).

Figure 1:
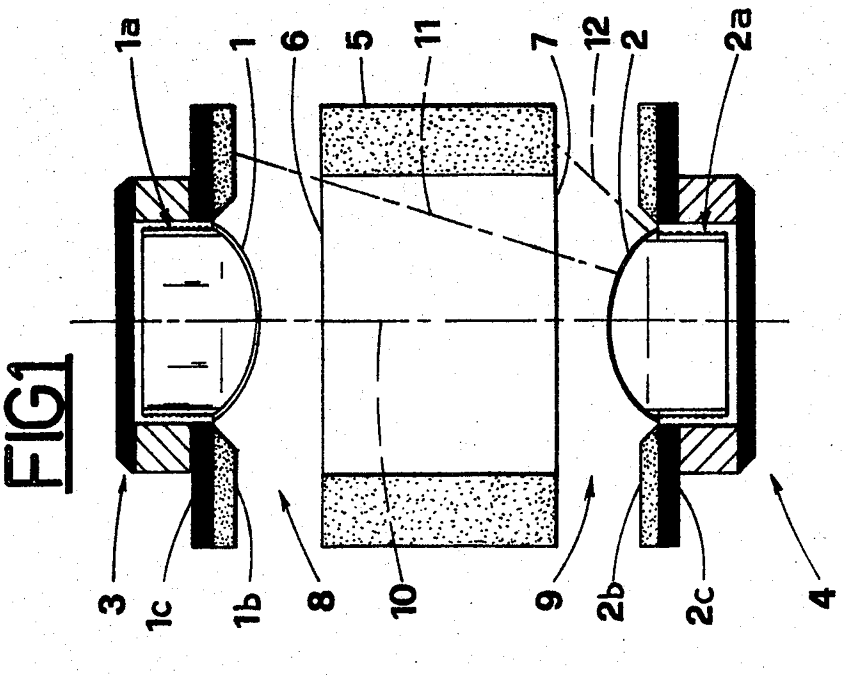
FIG. 1 shows, in a vertical elevation, a longitudinal section of the elements that constitute one way of the said diffusion plant.

The contour area of the said internal space is such as to intercept all the directions that issue radially from the said diaphragms. When, in fact, consideration is given to any one direction that issues radially from the diaphragms (1) and (2), it is noted that the said direction certainly meets one of the elements that delimitate the said internal space. By way of an example, in FIG. 1 are shown the directions (10), (11) and (12) that issue from the diaphragms (2) and meet the diaphragm (1), the flat element (1*b*) and the box shaped member (5), respectively.

As stated, the plant in question is of the multiway type, and the conformation of each way corresponds to the foregoing description, with the difference that the dimensions of the various elements vary for each individual way.

The ways that reproduce low frequency bands have vibrating diaphragms of a major diameter and, therefore, screening elements of major dimensions, while the ways that reproduce high frequency bands have vibrating diaphragms and screening elements of minor dimensions.

When assembling the plant in question, the various ways are so arranged that the diaphragms be coaxial one with the other. FIG. 2 shows one possible form of assembly for two of the said ways. The supporting surfaces (1*c*) and (2*c*), as also the box shaped members (5), are fixedly connected to a metal frame (12′) faced externally, for example, with a holed fabric (14) of the type normally used for this purpose. The plant is completed by electrical connections and filters, etcetera, of known types, which are not illustrated.

It is naturally possible to have in one and the same sound diffusion plant both ways that are conformed in the manner described above and ways whose conformation follows tradition, that is to say, ways constituted by one single dome, cone or other type loudspeaker.

This can be done, for example, for the lower frequencies that have been reproduced by means of one normal cone type loudspeaker. A low frequency way, the conformation of which corresponds to that described above, would, in fact, require dome type vibrating diaphragms of a considerable size, and this can lead to the plant being of a notable size which is something that may not be suitable, above all when it has to be installed in a room of modest dimensions.

The operation of the plant in question takes place in the manner described below, and the remarks made in relation to one way obviously apply to each way of the plant in question whose conformation follows the same pattern.

One and the same electric signal, corresponding to the sounds it is wished to reproduce and made up of waves having frequencies included within the frequency band that the way under consideration is able to reproduce, excites the electromagnetic circuits (1*a*) and (2*a*) which place the diaphragms (1) and (2), respectively, under vibration. The diaphragms generate sound waves which essentially consist of compressions and rarefactions of the air, audible to the human ear.

It is known that a vibrating diaphragm only generates spherical waves relevant to sounds whose wavelength is greater than the diameter of the diaphragms themselves, while for sounds of a wavelength lesser, waves that possess a certain directivity are generated.

In other words, the said sounds with a wavelength lesser than the diameter of the said diaphragm are propagated with greater intensity in the directions included within a cone, the axis of which is the axis of the vibrating diaphragm, which gets narrower in amplitude as the wavelength of the sound wave generated by the diaphragms decreases.

The directional waves generated by the diaphragms (1) and (2) meet along their path one of the said screening elements and thus they are strongly attenuated. The spherical waves generated by the diaphragms (1) and (2) are, instead, diffused in the outer space since the apertures (8) and (9) behave, on account of the acoustic diffraction phenomenon, as sources of spherical waves. To conclude, the way under consideration diffuses in the space sound waves that are almost spherical and have approximately the same intensity at all points equidistant from the source. In this way, the listener hears the same sound in any angular position he or she may be with respect to the source of the waves.

As stated, the electromagnetic circuits (1*a*) and (2*a*) that place the diaphragms (1) and (2), respectively, under vibration, are energized by the same electric signal; they therefore vibrate and generate acoustic waves whose fundamental frequencies are identical. On account of the diaphragms (1) and (2) being coaxially opposed, a notable increase in acoustic pressure is created in the internal space delimitated by the elements (1*b*) and (2*b*), by the box shaped members (5) and by the diaphragms (1) and (2); this considerably decreases the vibrations that the diaphragms (1) and (2) complete through inertia once the electric signal that energizes the relevant electromagnetic circuits ceases. Thus there is a decrease in the aforementioned "halo" effect that renders a sound unfaithful.

By causing the acoustic pressure to rise, the said arrangement of the diaphragms (1) and (2) also augments the intensity of the sound waves generated by the diffusion plant described herein.

In order to prevent the diaphragms (1) and (2) from becoming resonant, their thicknesses are different. In this way, although the diaphragms (1) and (2) generate acoustic waves of the same fundamental frequencies, they mainly generate different harmonic frequencies. In particular, the one whose gage is greater, that is to say, the diaphragm (1), strengthens the lower harmonic frequencies, while the one whose gage is lesser, that is to say, the diaphragm (2), strengthens the higher harmonic frequencies.

As stated previously, the electric signal that corresponds to the sound it is wished to reproduce is subdivided, by means of filters, into various frequency bands, each of which is reproduced by one way of the plant. The said filters do not, however, operate a distinct division of the frequencies and it is normal for the highest frequencies in the low frequency band to also be reproduced by the ways destined to reproduce sounds at a greater frequency. It thus happens in this way that one and the same sound is generated by a number of ways. It is, therefore, necessary that the path followed by the identical sounds generated in the various ways in order to reach the ear of the listener, be identical in length so as not to place the sound reproduced by one way out of phase with respect to the same sound reproduced by another of the ways. It has, in fact, been proved that the human ear is aware of such occurrences which render the reproduction of sound imperfect. For this purpose, all the vibrating diaphragms of the various ways are arranged coaxially one with respect to the other (see FIG. 2).

The plant described and illustrated by way of an example utilizes spherical cap shape vibrating diaphragms though, from a theoretical viewpoint, there is nothing to stop diaphragms of other types being used. Loudspeakers with cone type diaphragms could, for example, be employed. In practise, however, the said diaphragms are manufactured in an inexact fashion and would, therefore, be the cause of considerable difficulties.

Should new constructional technologies allow highly precise diaphragms of conical or other shapes to be produced, the plant in question could also be set up with the use thereof.

Modifications of a practical nature may be made to the plant forming the subject of the invention, just as, for example, the materials and the shape of the screening elements, as well as the methods of assembling the various ways, may be varied without, in any way, deviating from the conceptual ideas behind the invention as claimed below.

What is claimed is:

1. A sound diffusion system having very low directivity, in particular of the multiway type, essential features of which are that each way comprises: a pair of vibrating diaphragms placed coaxially opposite and facing each other with a space therebetween, each of said diaphragms being placed under vibration by a corresponding electromagnetic circuit with both of said electromagnetic circuits being energized by the same electric signal; and a plurality of screening elements made of high acoustic absorption material, shaped and arranged in such a way as to delimit in cooperation with said diaphragms, an internal space between said diaphragms that includes openings which communicate with the outside space and in which the high acoustic absorption material is positioned so that it intercepts all sound waves that issue radially from each diaphragm which do not intercept the other diaphragm.

2. A sound diffusion system according to claim 1 wherein said diaphragms are identical in shape and area.

3. A sound diffusion system according to claim 1 wherein said diaphragms are of spherical shape and are of different thicknesses.

4. A sound diffusion system according to claim 2 wherein said diaphragms are of spherical shape and are of different thicknesses.

5. A sound diffusion system according to claim 1 wherein said screening elements provided for each way comprise: a pair of flat elements each of which is fixedly connected to a flat supporting surface to which one of the said diaphragms is connected in such a way as to cover the part thereof not occupied by the diaphragm; and open-ended bottomless box-shaped member positioned between said diaphragms with its open ends facing the diaphragms at a distance away from each diaphragm less than the diameter of the diaphragms.

* * * * *